US006882046B2

(12) United States Patent
Davenport et al.

(10) Patent No.: US 6,882,046 B2
(45) Date of Patent: Apr. 19, 2005

(54) SINGLE PACKAGE CONTAINING MULTIPLE INTEGRATED CIRCUIT DEVICES

(75) Inventors: Joel Wayne Davenport, Albuquerque, NM (US); Robert R. Parker, Albuquerque, NM (US); Jeff E. Conder, Albuquerque, NM (US)

(73) Assignee: Koninklijke Phillips Electronics N.V., Eindhoven (NL)

( * ) Notice: Subject to any disclaimer, the term of this patent is extended or adjusted under 35 U.S.C. 154(b) by 123 days.

(21) Appl. No.: 10/024,936

(22) Filed: Dec. 18, 2001

(65) Prior Publication Data

US 2003/0006491 A1 Jan. 9, 2003

Related U.S. Application Data

(60) Provisional application No. 60/304,038, filed on Jul. 9, 2001.

(51) Int. Cl.[7] .............................................. H01L 23/34
(52) U.S. Cl. ...................................................... 257/725
(58) Field of Search ................................ 257/723–725, 257/690, 693, 773, 786

(56) References Cited

U.S. PATENT DOCUMENTS

| | | | | |
|---|---|---|---|---|
| 3,476,985 A | * | 11/1969 | Magner et al. | ............. 257/725 |
| 4,038,488 A | | 7/1977 | Lin | |
| 5,031,072 A | * | 7/1991 | Malhi et al. | ................ 361/387 |
| 5,138,436 A | * | 8/1992 | Koepf | ......................... 357/80 |
| 5,212,406 A | * | 5/1993 | Reele et al. | ................ 257/723 |
| 5,410,182 A | | 4/1995 | Kurafuchi et al. | |
| 5,723,906 A | * | 3/1998 | Rush | ......................... 257/723 |
| 5,786,628 A | * | 7/1998 | Beilstein, Jr. et al. | ...... 257/684 |
| 6,121,676 A | * | 9/2000 | Solberg | ...................... 257/686 |
| 6,407,334 B1 | * | 6/2002 | Jimarez et al. | ............ 174/52.4 |

FOREIGN PATENT DOCUMENTS

WO    WO0045420 A    8/2000

OTHER PUBLICATIONS

Ahmadi, Homi, Calculating Creepage and Clearance Early Avoids Design Problems Later, http://www.ce-mag.com/ce-mag.com/archive/01/03/ProductSafety.html, Mar. 2001.*

Cadence, Allegro Designer/ Allegro Expert Power Solutions for Today's PCB Challenges 1985, all pages.*

Texas Instruments, FT4500 Series, 20–Watt 24v–Input Isolated DC/DC Converter, Excaliber, SLT9153, (Revised Jun. 21, 2001.

Burr–Brown ISO150, Dual, Isolated, Bi–Directional Digital Coupler, 1993 Burr–Brown Corporation, PDS–1213B, Printed in USA Aug., 1994.

Sharp PC123/PC123F, European Safety Standard Approved Type Long Creepage Distance Photocoupler.

* cited by examiner

*Primary Examiner*—David A. Zarneke
(74) *Attorney, Agent, or Firm*—Peter Zawilski

(57) ABSTRACT

The present invention allows multiple IC devices to be placed on the same substrate within a single BGA package. The invention requires minimum distances to be kept between electrical connections of the IC devices to maintain the electrical isolation, so that the devices can be operated at different voltage differentials. Signals between the devices can be connected externally from the package to each other utilizing galvanic isolation techniques. The invention provides the flexibility of choice for the customers to use isolation or not between the devices and takes up less PC board space because only a single package is used on the board.

12 Claims, 8 Drawing Sheets

| VOLTAGE BETWEEN CONDUCTORS (DC OR AC PEAKS) | MINIMUM SPACING ||||||| 
|---|---|---|---|---|---|---|---|
| | BARE BOARD |||| ASSEMBLY |||
| | B1 | B2 | B3 | B4 | A5 | A6 | A7 |
| 0-15 | 0.05 mm | 0.1 mm | 0.1 mm | 0.1 mm | 0.05 mm | 0.13 mm | 0.13 mm | 0.13 mm |
| 16-30 | 0.05 mm | 0.1 mm | 0.1 mm | 0.1 mm | 0.05 mm | 0.13 mm | 0.25 mm | 0.13 mm |
| 31-50 | 0.1 mm | 0.6 mm | 0.6 mm | 0.6 mm | 0.13 mm | 0.13 mm | 0.4 mm | 0.13 mm |
| 51-100 | 0.1 mm | 0.6 mm | 0.6 mm | 1.5 mm | 0.13 mm | 0.13 mm | 0.5 mm | 0.13 mm |
| 101-150 | 0.2 mm | 0.6 mm | 0.6 mm | 3.2 mm | 0.4 mm | 0.4 mm | 0.8 mm | 0.4 mm |
| 151-170 | 0.2 mm | 1.25 mm | 1.25 mm | 3.2 mm | 0.4 mm | 0.4 mm | 0.8 mm | 0.4 mm |
| 171-250 | 0.2 mm | 1.25 mm | 1.25 mm | 6.4 mm | 0.4 mm | 0.4 mm | 0.8 mm | 0.4 mm |
| 251-300 | 0.2 mm | 1.25 mm | 1.25 mm | 12.5 mm | 0.4 mm | 0.4 mm | 0.8 mm | 0.8 mm |
| 301-500 | 0.25 mm | 2.5 mm | 2.5 mm | 12.5 mm | 0.8 mm | 0.8 mm | 1.5 mm | 0.8 mm |
| >500 SEE PARA. 6.3 FOR CALC. | 0.0025 mm /VOLT | 0.005 mm /VOLT | 0.005 mm /VOLT | 0.025 mm /VOLT | 0.00305 mm /VOLT | 0.00305 mm /VOLT | 0.00305 mm /VOLT |

B1 - INTERNAL CONDUCTORS
B2 - EXTERNAL CONDUCTORS, UNCOATED, SEA LEVEL TO 3050 M
B3 - EXTERNAL CONDUCTORS, WITH PERMANENT POLYMER COATING (ANY ELEVATION)
A5 - EXTERNAL CONDUCTORS, WITH CONFORMAL COATING OVER ASSEMBLY (ANY ELEVATION)
A6 - EXTERNAL COMPONENT TERMINATION, UNCOATED
A7 - EXTERNAL COMPONENT LEAD TERMINATION, WITH CONFORMAL COATING (ANY ELEVATION)

FIG. 1B

SINGLE PACKAGE CONTAINING MULTIPLE INTEGRATED CIRCUIT DEVICES

This application claims the benefit of U.S. Provisional Application No. 60/304,038, filed on Jul. 9, 2001.

BACKGROUND OF THE INVENTION

The invention relates generally to semiconductor integrated circuit (IC) packages and more particularly, it relates to an improved ball grid array (BGA) package which contains multiple IC devices electrically isolated from each other.

Conventionally, IC devices are mounted on a PC board and electrical isolation of the IC devices is maintained on the board. In order to efficiently use spaces on the PC board, there are packages which contain multiple IC devices, commonly referred to as multi-chip modules (MCM's). These devices are connected to each other inside the package and share both the power and ground levels. Simple packages, which contain two IC devices and maintain them electrically isolated within a single package, are also used. The IC devices within such simple packages are limited to simple transceivers and DC to DC converters, and such packages are limited to DIP (dual in package), SOJ (small outline J lead), QFP (quad flat package) and high QFP. These simple packages are typically small in size and the number of pins for these packages varies from less than 48 (for DIP and SOJ) to 144 (for high QFP) pins. They are ideal for simple IC devices.

Attempts have been made to maintain electrical isolation of IC devices of complex designs within a single package. Such efforts, however, have not proved to be successful due to a number of factors including the difficulties associated with high pin density of complex IC devices. For example, a multi-layered BGA package typically includes 64 to 1000 pins on a 2 inch by 2 inch area. Also, there are obstacles associated with the spacing requirements between the internal IC devices to maintain a small package footprint.

Therefore, there is a need for implementing electrical isolation of large scale IC devices of complex designs within a single package.

SUMMARY OF THE INVENTION

The present invention allows multiple IC devices to be placed on the same substrate within a single BGA package. The invention requires minimum distances to be kept between electrical connections of the IC devices to maintain the electrical isolation, so that the devices can be operated at different voltage differentials. Signals between the devices can be connected externally from the package to each other utilizing galvanic isolation techniques.

According to the invention, a ball grid array (BGA) package having a plurality of external connection contacts is provided. The package comprises a first device having a plurality of electrical connections connected to a first set of the external electrical connection contacts; and a second device having a plurality of electrical connections connected to a second set of the external connection contacts. The first and second sets of the external electrical connections are segregated in two sections which are electrically isolated from each other. The electrical isolation is maintained according to an ANSI/IPC-2221 standard maintained by American National Standards Institute (ANSI).

According to the invention, the package further comprises a plurality of layers, including a signal layer, a power layer, a ground layer and a bottom layer. Each of the layers includes two sets of electrical connections that are segregated in two sections which are electrically isolated from each other. The two sets of electrical connections are respectively connected to the first and second devices.

The invention provides the flexibility of choice for the customers to use isolation or not between the devices and takes up less PC board space because only a single package is used on the board.

Other objects and attainments together with a fuller understanding of the invention will become apparent and appreciated by referring to the following description and claims taken in conjunction with the accompanying drawings.

BRIEF DESCRIPTION OF THE DRAWINGS

The invention is explained in further detail, and by way of example, with reference to the accompanying drawings wherein:

FIG. 1B shows Table 6-1 of the ANSI/IPC-2221 standard;

Throughout the drawings, the same reference numerals indicate similar or corresponding features or functions.

DETAILED DESCRIPTION OF THE PREFERRED EMBODIMENTS

Figure 1A:
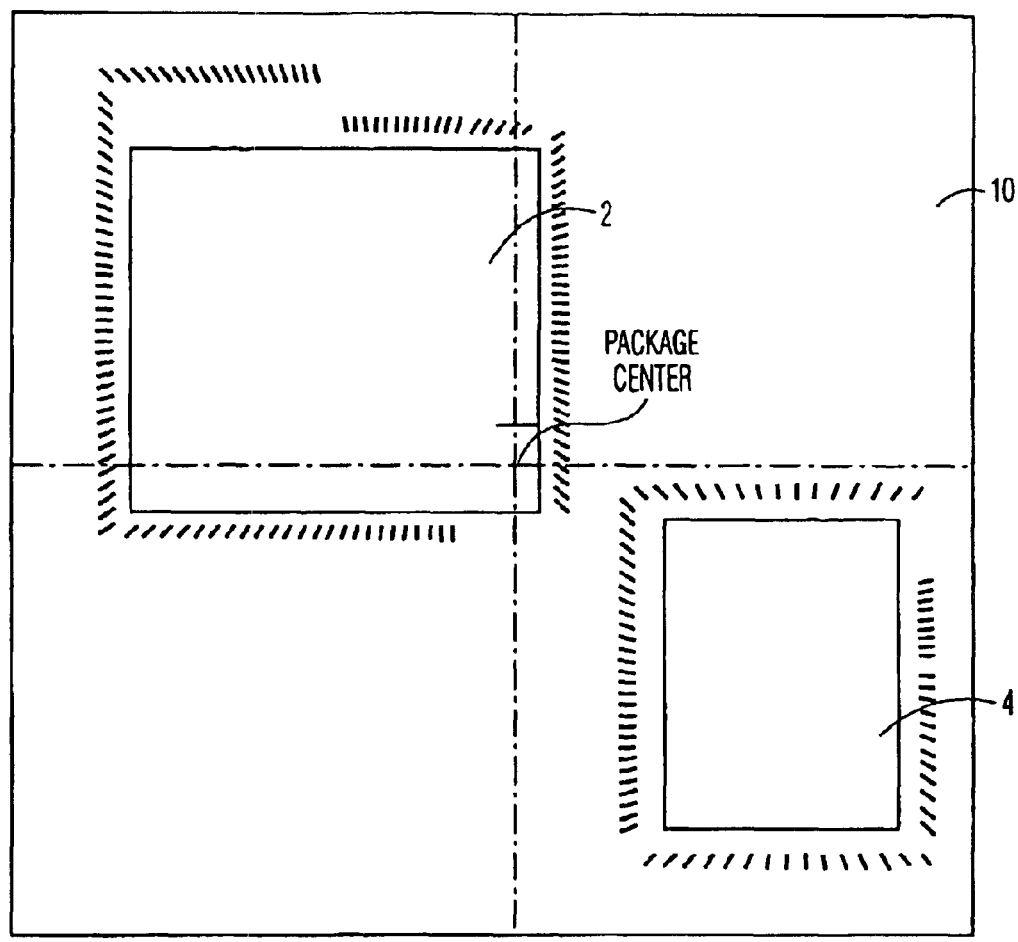
FIG. 1A shows a layout of two IC devices inside a ball grid array package according to one embodiment of the invention.

FIG. 1A shows a layout of two IC devices 2 and 4 inside a ball grid array (BGA) package 10 according to one embodiment of the invention. These devices are placed on the same package substrate in package 10 and are electrically isolated from each other. In this exemplary layout, device 2 may be a L41 chip, which is a 1394a Link Layer Controller with copy protection and device 4 may be a P23 chip, which is 1394a Physical Layer Controller with two ports. Both L41 and P23 chips are available from Philips Semiconductors, Inc., Sunnyvale, Calif.

According to the invention, each IC device should be placed on the package substrate in an orientation that allows segregation of the electrical connections of the IC devices placed at specific areas. For example, two IC devices would be placed in two different sections as in FIG. 1A; three IC devices would be placed in three different sections, etc. Furthermore, the electrical connections of the devices on the substrate are maintained at the minimum physical distances (e.g., 0.5 mm) in accordance with Table 6-1 of the ANSI/IPC-2221 standard, as shown in FIG. 1B, to achieve desired electrical isolation between the two devices in the two segregated sections. ANSI/IPC-2221 standard is a generic standard on printed board design maintained by American National Standards Institute, which is hereby incorporated by reference.

Figure 2A:
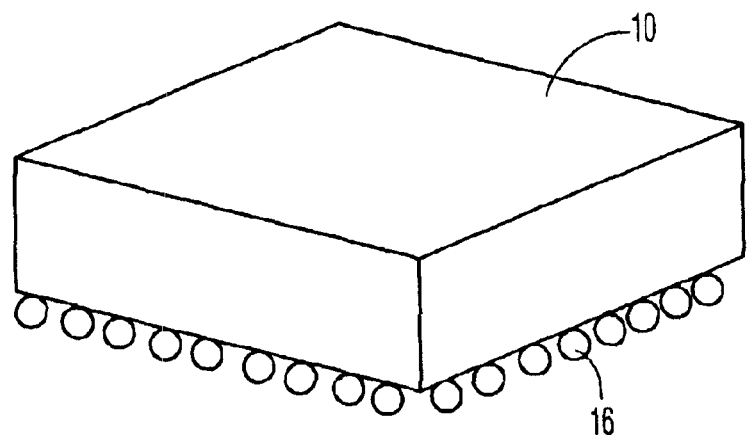
FIG. 2A shows a perspective view of the package.
Figure 2B:
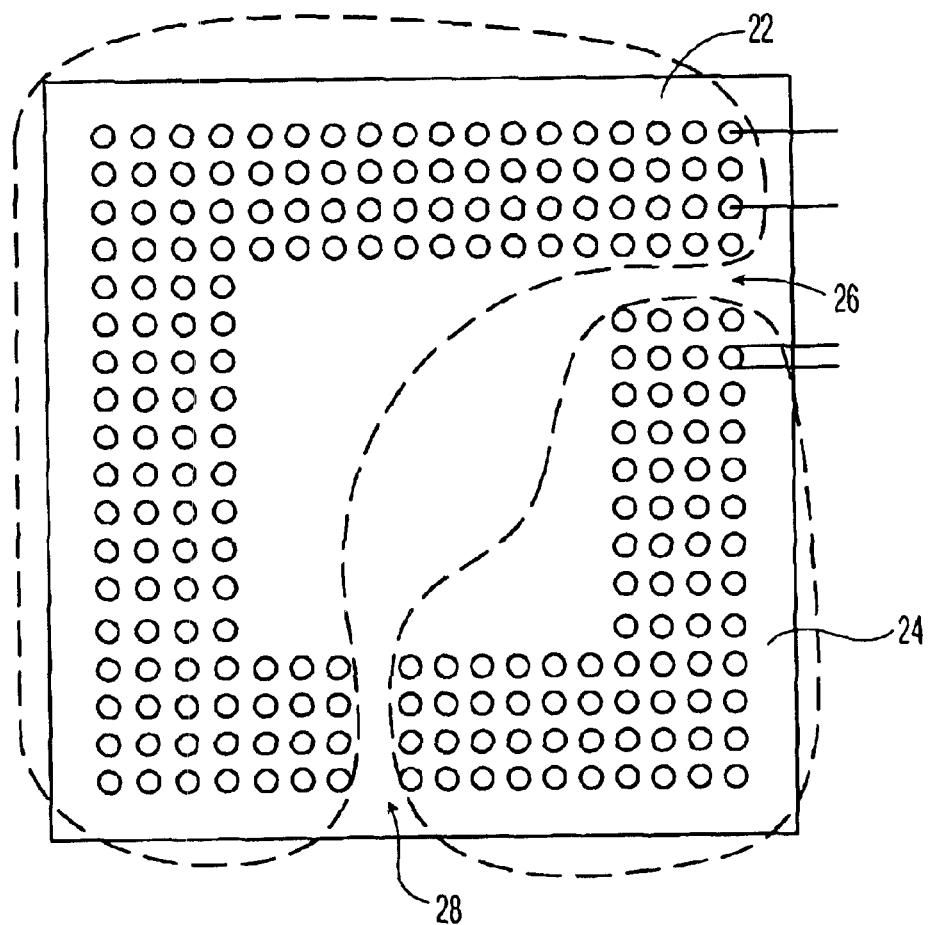
FIG. 2B shows a bottom view of the package.

FIG. 2A shows a perspective view of package 10 having a plurality of solder balls 16, which are used for connecting to one another and to other external devices. FIG. 2B shows a bottom view of package 10. As shown in FIG. 2B, there are two sets of external electrical connection contacts 22 and 24 in the form of solder balls, associated with devices 2 and 4, respectively. Two spacing gaps 26 and 28 separate the two sets of external electrical connection contacts in two sections to maintain electrical isolation between devices 2 and 4. Spacing gaps 26 and 28 are created by removing the external connection contacts in the pre-selected areas. Spacing gaps 26 and 28 are also maintained at the minimum physical widths in accordance with Table 6-1 of the ANSI/IPC-2221 standard described above.

Figure 3:
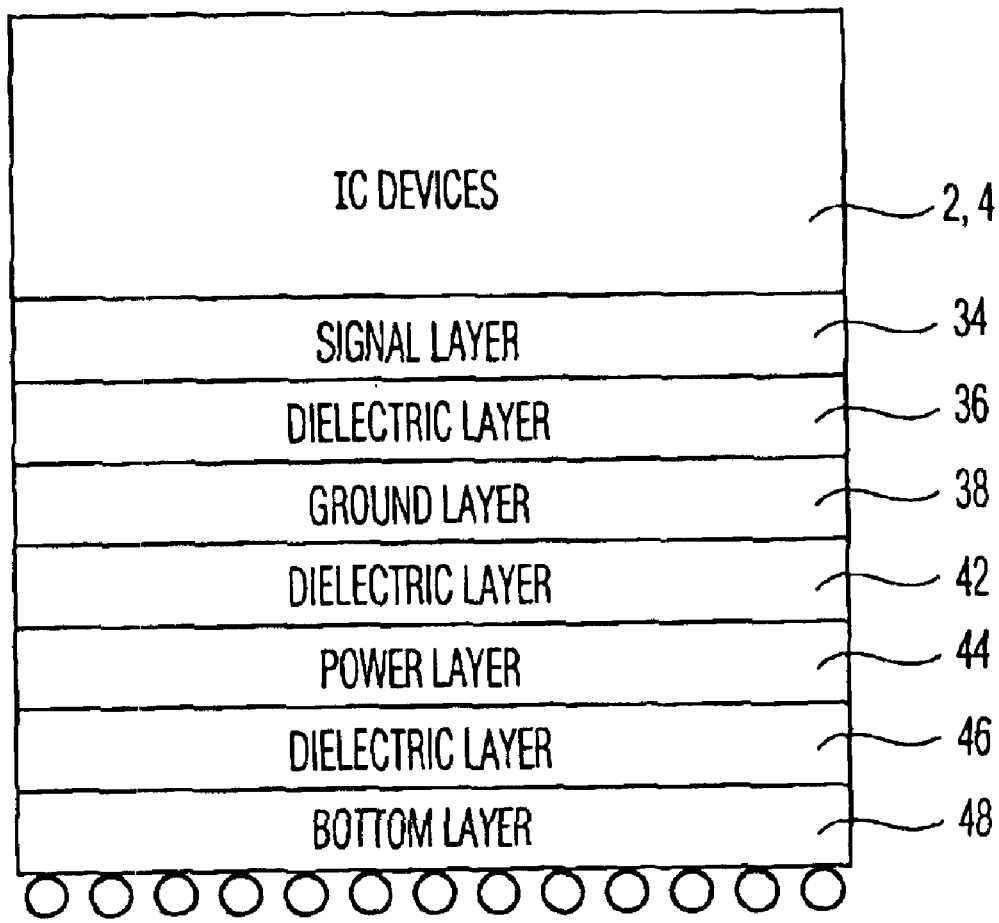
FIG. 3 shows a simplified cross-sectional view of the package.

FIG. 3 shows a simplified cross-sectional view of package 10. As illustrated in FIG. 3, there are a plurality of layers including a signal layer 34, a dielectric layer 36, a ground layer 38, a dielectric layer 42, a power layer 44, a dielectric layer 46 and a bottom layer 48, which are stacked on one another. Devices 2 and 4 are placed on signal layer 34. Dielectric layer 36 provides electrical isolation between signal layer 34 and ground layer 38; dielectric layer 42 provides electrical isolation between ground layer 38 and power layer 44; and dielectric layer 46 provides electrical isolation between power layer 44 and bottom layer 48.

Figure 4A:
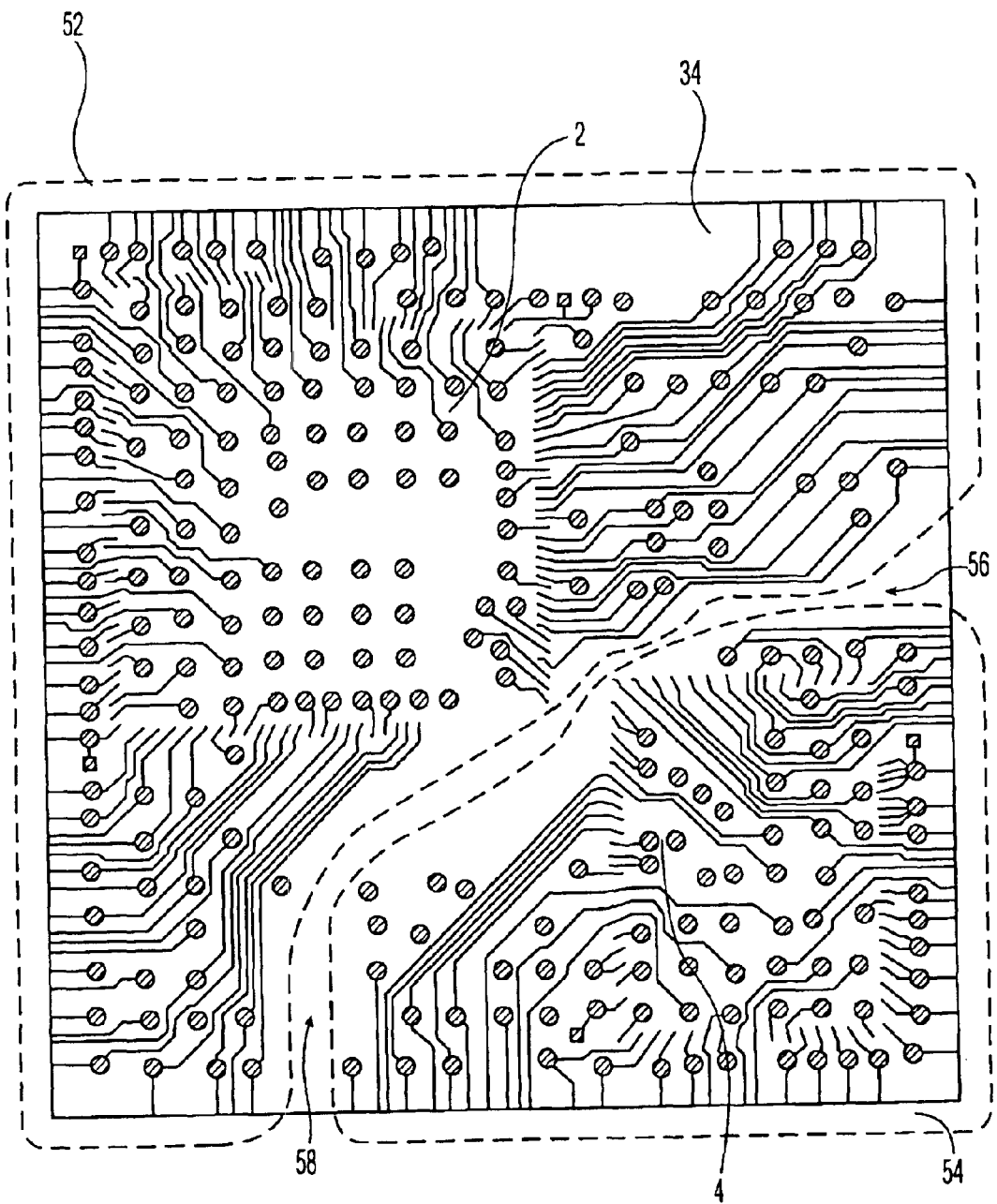
FIG. 4A shows a plan view of the signal layer inside the package.

FIG. 4A shows a plan view of signal layer 34 inside package 10. In FIG. 4A, two sets of electrical connection nodes and traces 52 and 54 are separated by spacing gaps 56 and 58 to maintain electrical isolation between the signal paths of devices 2 and 4 in accordance with the ANSI/IPC standard mentioned above. Signals between devices 2 and 4 can be connected externally from the package to each other, utilizing galvanic isolation techniques.

Figure 4B:
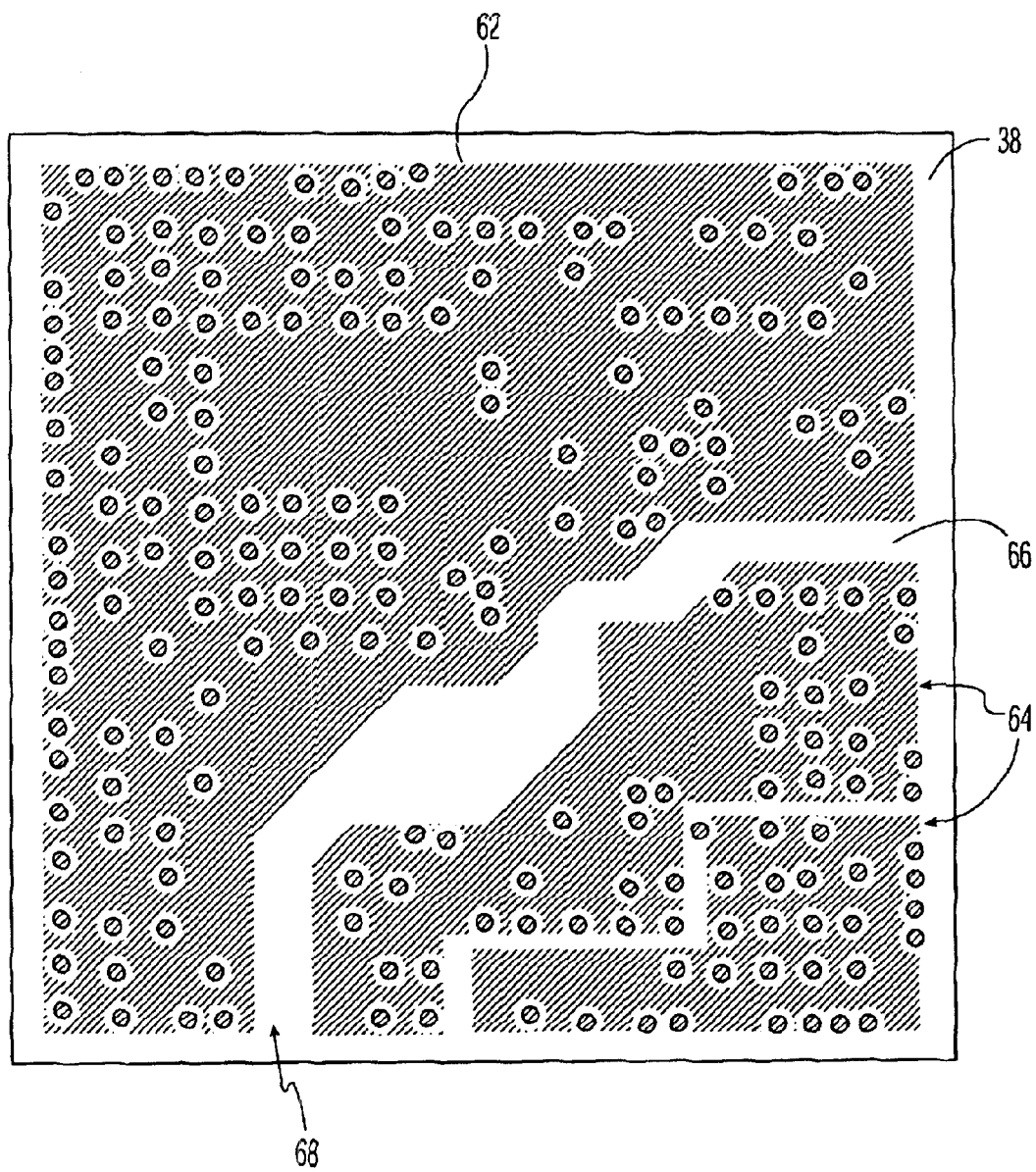
FIG. 4B shows a plan view of the ground layer inside the package.

FIG. 4B shows a plan view of ground layer 38 inside package 10. In FIG. 4B, two sets of electrical connection nodes and traces 62 and 64 are also separated by spacing gaps 66 and 68 to maintain electrical isolation between the ground paths of devices 2 and 4 in accordance with the ANSI/IPC standard mentioned above. This allows the two devices to have different ground reference levels. For example, the ground reference level for device 2 may be 0 V, while the ground reference level for device 4 may be +30 V. According to the invention, the difference between the ground reference levels of the two chips may be in the range of 0 to 300 V.

Figure 4C:
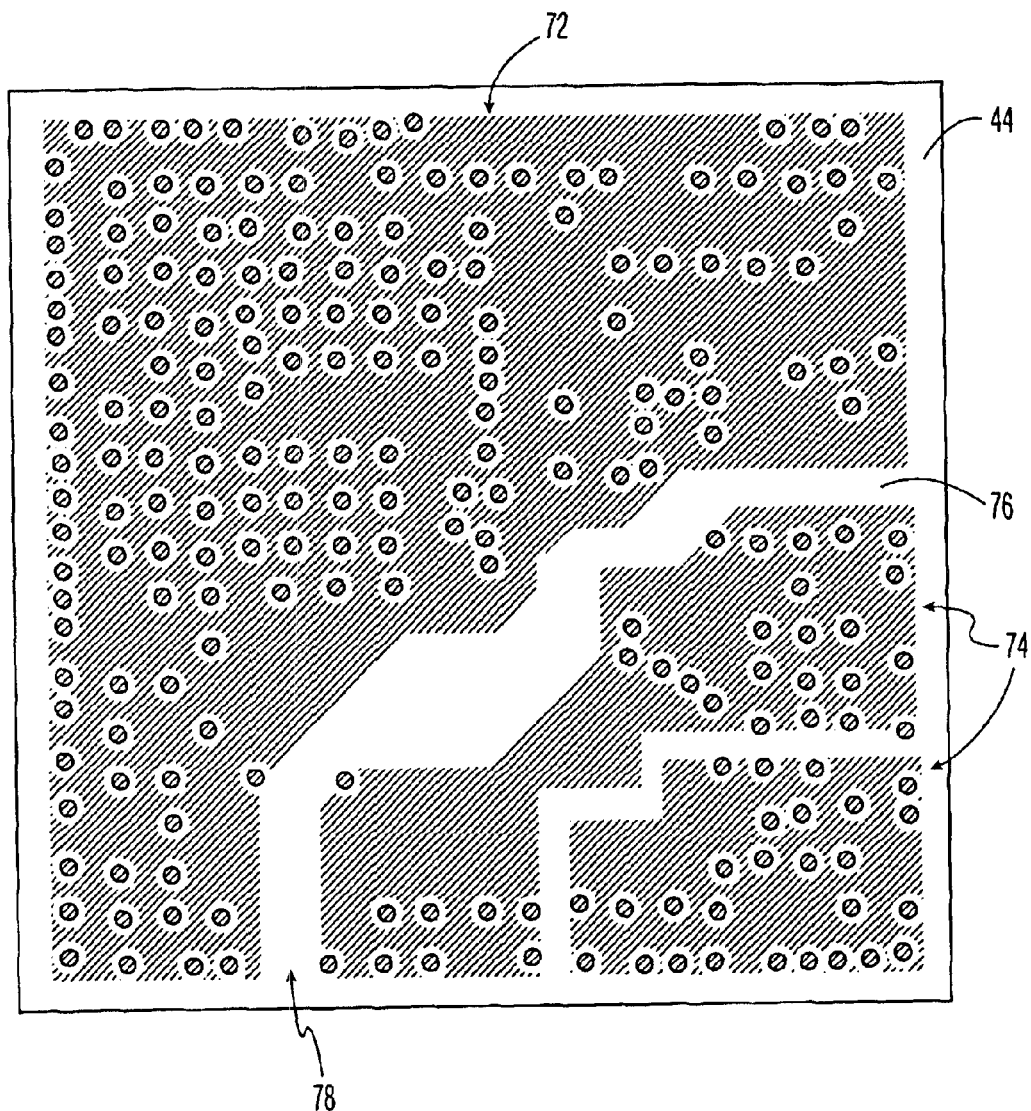
FIG. 4C shows a plan view of the power layer inside the package.

FIG. 4C shows a plan view of power layer 44 inside package 10. As shown in FIG. 4C, electrical connection nodes and traces 72 and 74 are again separated by spacing gaps 76 and 78 to maintain electrical isolation between the power paths of devices 2 and 4 in accordance with the ANSI/IPC standard mentioned above. This similarly allows the two devices to have different power levels. For example, the power level for device 2 may be 3.3 V with respect to its associated ground reference level, while the power level for device 4 may be 2.7 V with respect to its associated ground reference level.

Figure 4D:
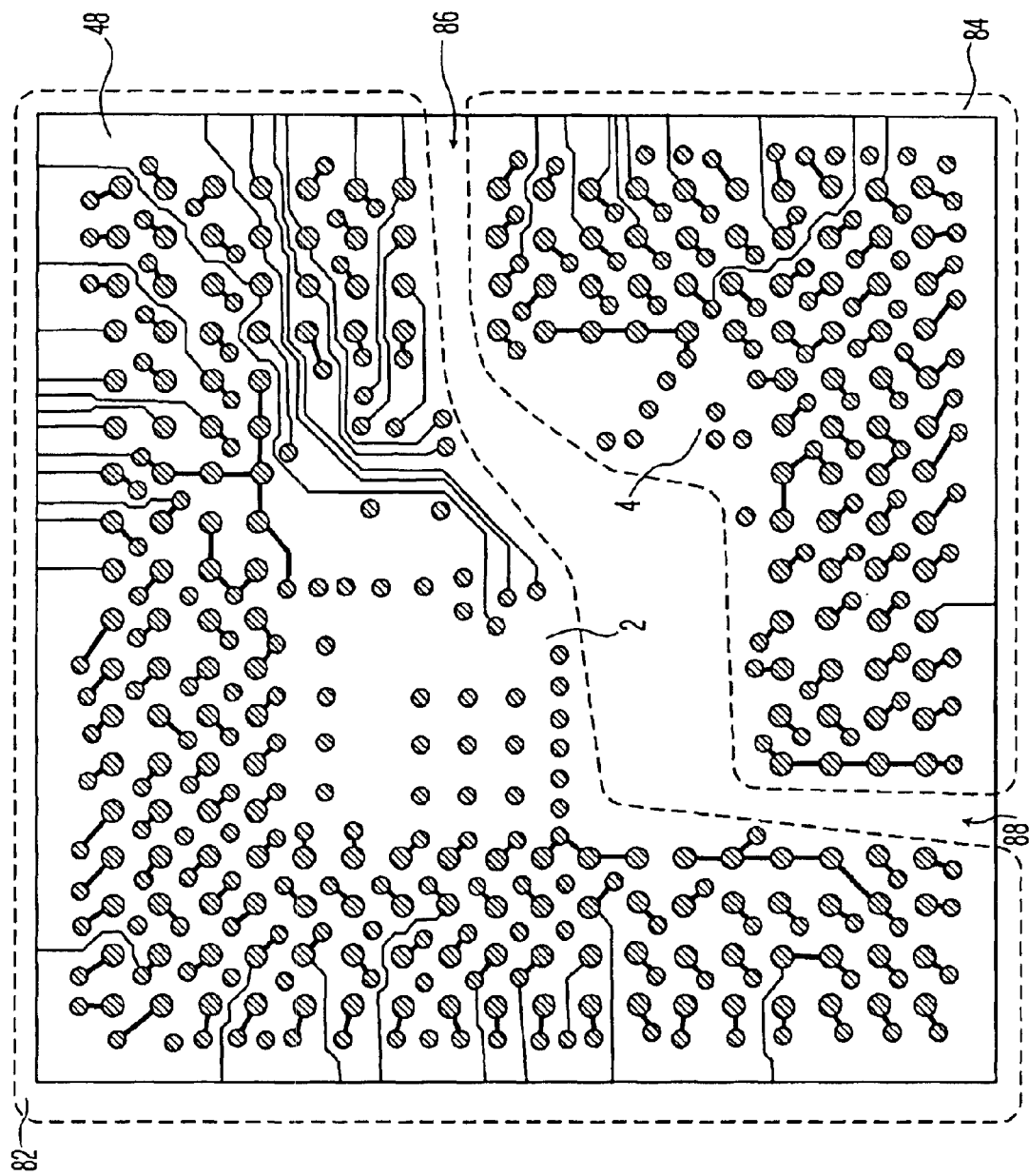
FIG. 4D shows a plan view of the bottom view of the package in detail.

FIG. 4D shows a plan view of bottom layer 48 of package 10, which is similar as that shown in FIG. 2B, but with more details. As shown in FIG. 4D, electrical connection nodes and traces 82 and 84 are similarly separated by spacing gaps 86 and 88 to maintain electrical isolation between devices 2 and 4 in accordance with the ANSI/IPC standard mentioned above.

The invention provides the flexibility of choice for the customers to use isolation or not between the devices. The invention also takes up less PC board space because only one package is used on the board, rather than multiple packages.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A ball grid array (BGA) package assembly having a plurality of external connection contacts, comprising:

a first device, disposed on the BGA package, and having a plurality of electrical connections connected to a first set of the external electrical connection contacts; and a second device, disposed on the BGA package, and having a plurality of electrical connections connected to a second set of the external electrical connection contacts;

wherein the first and second sets of the external electrical connections are segregated in two sections which are electrically isolated from each other, and the two sections are separated by at least a first distance wherein the first distance is based upon an expected difference in operating voltage between the first device and the second device.

2. The package of claim 1, wherein the first distance is in accordance with a predetermined standard.

3. The package of claim 2, wherein the standard specifies a physical separation distance between conductors based at least upon a voltage between the conductors.

4. The package of claim 1, further comprising:

a plurality of layers, including a signal layer, a power layer, a ground layer and a bottom layer;

wherein each of the layers includes two sets of electrical connections that are segregated in two sections which are electrically isolated from each other, and the two sets of electrical connections are respectively connected to the first and second devices.

5. The package of claim 4, wherein the standard specifies a physical separation distance between conductors based at least upon a voltage between the conductors.

6. The package of claim 1, wherein the first and second devices are semiconductor integrated circuit (IC) devices.

7. The package of claim 6, wherein the IC devices are communications devices.

8. A ball grid array package, comprising:

a plurality of layers, including a signal layer, a power layer, a ground layer and a bottom layer;

wherein each of the layers includes a plurality of sets of electrical conductors that are segregated into a corresponding plurality of sections which are electrically isolated from one another by a minimum distance based upon an expected voltage difference between the sets of electrical conductors, each of the plurality of sets of electrical conductors being adapted for connection to a corresponding integrated circuit.

9. The package of claim 8, wherein the plurality of sections are segregated in accordance with a predetermined standard.

10. The package of claim 9, wherein the predetermined standard specifies a physical separation distance between conductors of the package based at least upon a voltage between the conductors.

11. The package of claim 8, wherein the first and second devices are semiconductor integrated circuit (IC) devices.

12. The package of claim 11, wherein the IC devices are communications devices.

\* \* \* \* \*